United States Patent [19]

Sawaya

[11] Patent Number: 4,963,975
[45] Date of Patent: Oct. 16, 1990

[54] SEMICONDUCTOR DEVICE
[75] Inventor: Hiromichi Sawaya, Kawasaki, Japan
[73] Assignee: Kabushiki Kaisha Toshiba, Kawasaki, Japan
[21] Appl. No.: 467,350
[22] Filed: Jan. 22, 1990

Related U.S. Application Data

[63] Continuation of Ser. No. 405,048, Sep. 11, 1989, abandoned, which is a continuation of Ser. No. 248,449, Sep. 23, 1988, abandoned.

[30] Foreign Application Priority Data

Sep. 26, 1987 [JP] Japan ................................ 62-241366

[51] Int. Cl.⁵ .......................................... H01L 23/02
[52] U.S. Cl. ...................................... 357/81; 357/70; 357/72; 357/55
[58] Field of Search ....................... 357/81, 70, 72, 55

[56] References Cited

U.S. PATENT DOCUMENTS 4,791,472 12/1988 Okikawa et al. ...................... 357/70

Primary Examiner—Andrew J. James
Assistant Examiner—Mark Prenty
Attorney, Agent, or Firm—Finnegan, Henderson, Farabow, Garrett, and Dunner

[57] ABSTRACT

A semiconductor device includes a semiconductor chip, a heat radiation plate having a mounting portion on which the semiconductor chip is mounted, lead terminals connected to the semiconductor chip, a mold resin for sealing the semiconductor chip and parts of the lead terminals in cooperation with the heat radiation plate. The semiconductor device further includes output portions for interrupting a stress applied to the semiconductor chip.

12 Claims, 4 Drawing Sheets

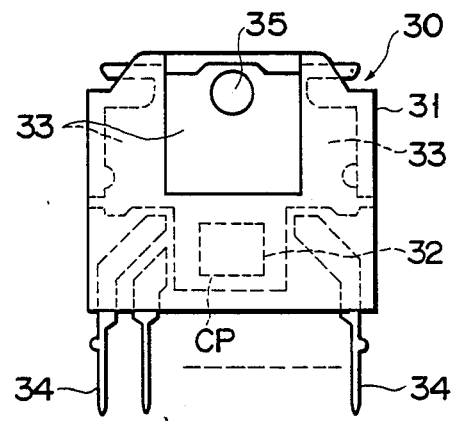
F I G. 1
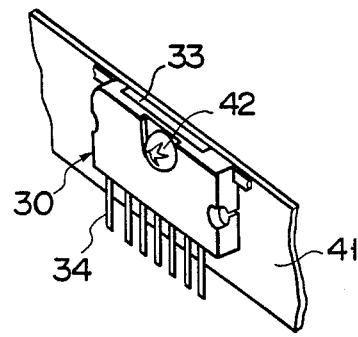
F I G. 2A
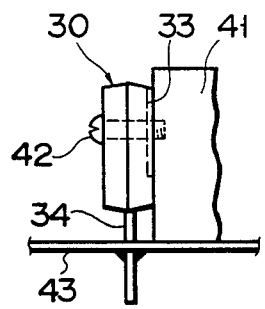
F I G. 2B
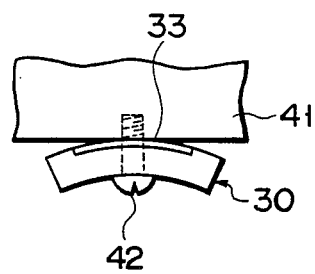
F I G. 2C

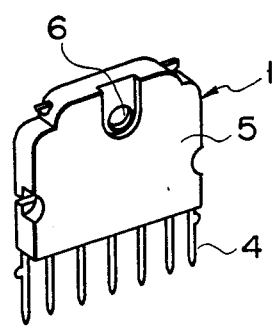
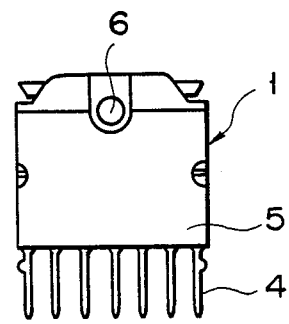
F I G. 3A    F I G. 3B
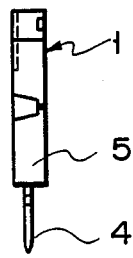
F I G. 3C
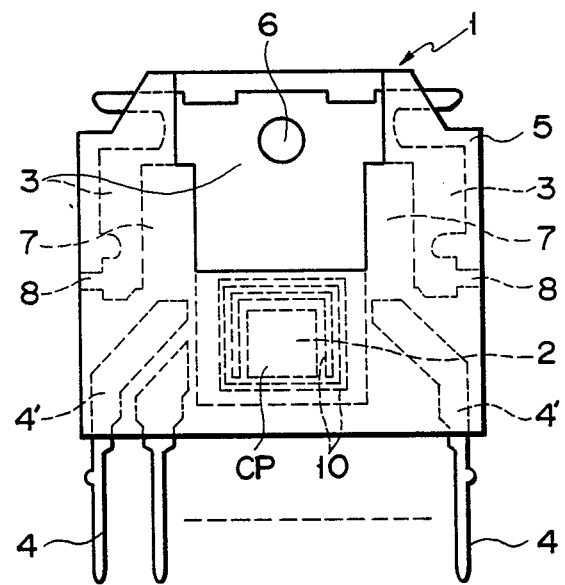
F I G. 3D

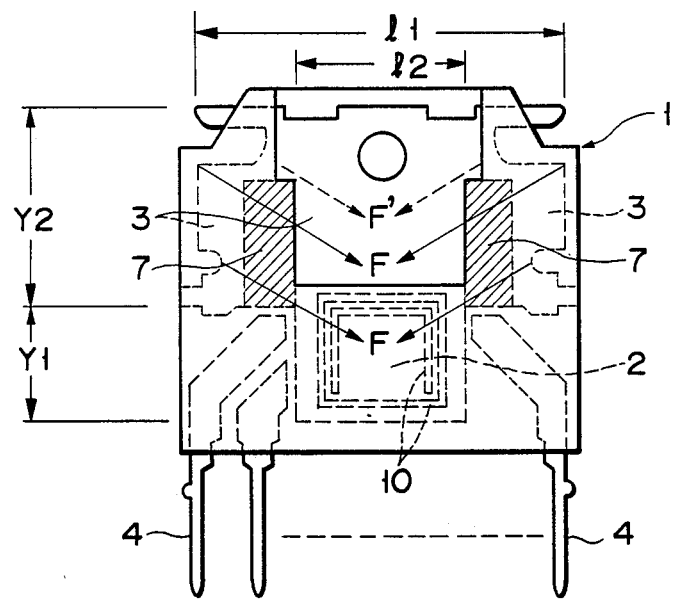
F I G. 5

SEMICONDUCTOR DEVICE

This application is a continuation of application Ser. No. 405,048, filed Sept. 11, 1989, and now abandoned, which is a continuation of application Ser. No. 248,449, filed Sept. 23, 1988, and now abandoned.

BACKGROUND OF THE INVENTION

1. Field of the Invention

This invention relates to a semiconductor device such as a power transistor and a power semiconductor IC, and more particularly to a semiconductor device having a heat radiating portion partially exposed from a mold package.

2. Description of the Related Art

FIG. 1 is a perspective view showing the construction of conventional power IC device 30 as viewed from the rear side. Power IC device 30 includes semiconductor chip CP, mold resin 31, heat radiating metal plate 33 and lead terminals 34. Heat radiating plate 33 includes island portion 32. Semiconductor chip CP is fixed on island portion 32 on the front surface of heat radiating plate 33, and lead terminals 34 are connected to semiconductor chip CP. Further, semiconductor chip CP is packaged together with lead terminal 34 and heat radiating plate 33 by mold resin 31, and part of the rear surface of heat radiating plate 33 is exposed. The power IC device further includes hole 35 formed through heat radiating plate 33 and mold resin 31.

In order to mount IC device 30 on heat radiation chassis 41 of an electronic instrument, transistor device 30 is fixed to chassis 41 by means of screw 42 or clip as shown in FIGS. 2A and 2B and at the same time the exposed portions of lead terminals 34 are connected to the circuit of the electronic instrument. More specifically, IC device 30 is mounted with the rear surface of heat radiation plate 33 held to face heat radiation chassis 41, and lead terminals 34 are soldered to printing circuit board 43 of the circuit of the electronic instrument.

In general, IC device 30 will be curved after the molding process as shown in FIG. 2C because of the difference between the heat characteristics of the mold resin and metal of the heat radiation plate. When the IC device is mounted by screw 42 or clip in the condition shown in FIGS. 2C, it will be less curved. However, at this time, cracks will be easily made in the semiconductor chip by the mechanical stress. Further, if temperature of transistor device 30 rises during the operation, the mold resin is deformed by thermal stress and cracks may be made in the semiconductor chip, particularly when mold resin 31, heat radiation plate 33 and semiconductor chip CP are of low-quality, materials. Therefore, it is difficult to reduce the possibility of making a chip having cracks to 0.1% or less by using the ordinary screening method in the mass-production process.

In order to prevent cracks from being made in the semiconductor chip, materials having expansion coefficients substantially equal to each other may be used to form a less curved IC device, for example. However, in this case, it becomes difficult to maintain the present heat radiation efficiency of IC device 30. For this reason, it is now common practice to set optimum margin for formation of the cracks by strictly controlling the manufacturing process of IC device 30

SUMMARY OF THE INVENTION

An object of this invention is to provide a semiconductor device in which cracks will not be made in the semiconductor chip even if stress in the resin caused by the temperature variation or the stress occurring at the time of mounting is applied thereto.

The above object can be attained by a semiconductor device comprising a semiconductor chip; a heat radiation metal plate having a chip mounting portion to which the semiconductor chip is mounted; a lead member connected to the semiconductor chip; and a mold member for sealing the semiconductor chip and part of the lead member in cooperation with the heat radiation plate, and an interrupting section for interrupting a stress applied to the semiconductor chip.

According to the semiconductor device of the present invention, when the device is fixed on an external heat radiation plate by means of a clip, for example, stress applied to the semiconductor chip is reduced by the interrupting section. Therefore, cracks can be prevented from being made in the semiconductor chip.

BRIEF DESCRIPTION OF THE DRAWINGS

FIG. 1 is a perspective view showing the construction of a conventional power IC device;

FIGS. 2A to 2C show the power IC device which is fixed to an external chassis;

FIGS. 3A to 3C are exterior views of a power IC device according to one embodiment of this invention;

FIG. 3D is a perspective view showing the construction of the power IC device shown in FIGS. 3A to 3C;

FIG. 5 is an illustrative view showing stresses occurring when the power IC device shown in FIGS. 3A to 3D is mounted.

DETAILED DESCRIPTION OF THE PREFERRED EMBODIMENTS

Figure 4A:
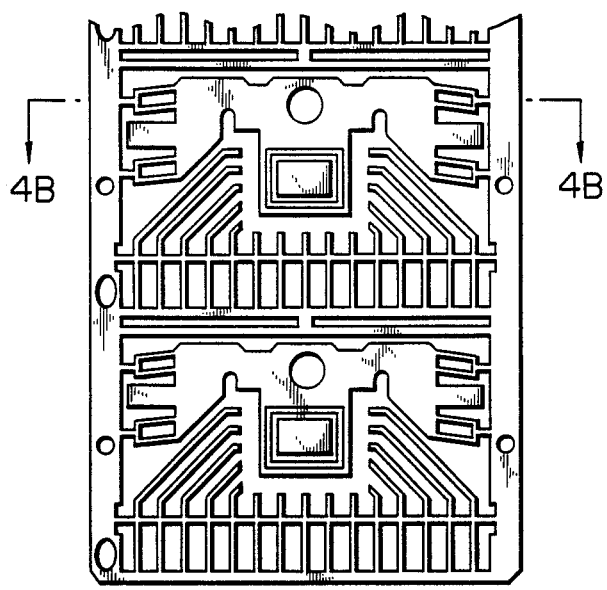
FIGS. 4A and 4B are front and cross sectional views of a lead frame part of which is formed of a heat radiation plate and lead terminals shown in FIG. 3D.

There will now be described a power IC device according to this invention with reference to FIGS. 3A to 3D.

The power IC device is used in audio equipments, office automated instruments, factory automated instruments or the like. FIG. 3A is an exterior view of power IC device 1, FIG. 3B shows the front side thereof, FIG. 3C shows the side surface thereof, and FIG. 3D shows the enlarged power IC device part of which is perspectively viewed from the rear.

The power IC device includes semiconductor chip CP, mold resin 5, heat radiating metal plate 3 and lead terminals 4. Part of heat radiating plate 3 is used as mounting portion (island portion) 2 of semiconductor chip CP. Semiconductor chip CP is mounted on island portion 2 on the front side of heat radiation plate 3, and is electrically connected to inner lead portions 4' of lead terminals 4 via bonding wires or the like. Lead terminals 4 are formed with the same thickness as heat radiation plate 3, for example, and set at a height different from that of heat radiation plate 3 in a thickness direction of the IC device. Island portion 2, heat radiation plate 3 and inner lead portion 4' are sealed by mold resin 5 forming the outer casing. In this case, part of the rear surface of heat radiation plate 3 is exposed to the exterior. Hole 6 is formed through mold resin 5 and heat radiation plate 3, and is used to fit the IC device to an exterior member by a screw or the like.

Heat radiation plate 3 of the IC device has two cutout portions 7 which are formed adjacent to and on both sides of island portion 2 and which extend in a direction along the line connecting island portion 2 and hole 6. That is, cutout portions 7 are obtained by removing part of heat radiation plate 3 on the side of lead terminal 4. Cutout portions 7 are filled with mold resin 5.

Figure 4B:

Heat radiation plate 3 and lead terminal 4 are part of the lead frame shown in FIG. 4, and are cut apart from the supporting portion of the frame after the resin sealing process. For example, heat radiation plate 3 is held by means of the frame via portion 8 before separation. Further, semiconductor chip CP is surrounded by two grooves 10 formed in island portion 2. The internal groove is used to receive extra solder which is produced when semiconductor chip CP is mounted on island portion 2 by use of solder. The outer groove is used to prevent moisture from entering through a gap between the mold resin and the lead frame.

When transistor device 1 is mounted, a screw is inserted into hole 6 and fastened with exposed portion of heat radiation plate 3 held to face an external member (such as a chassis) for heat radiation. In this case, as shown in FIG. 5, stress F indicated by a solid line arrow occurs to cause cracks in semiconductor chip CP in the prior art. However, in the above embodiment, cutout portions 7 indicated by oblique lines are provided, and stress F is interrupted by cutout portions 7, so that the position of occurrence of stress F' is moved in a direction away from island portion 2 as shown by broken lines. Width 12 between cutout portions 7 is smaller than total width 11 of heat radiation plate 3, and therefore stress F' indicated by the arrow of broken lines becomes smaller than stress F indicated by the solid line arrow. In this way, in the above embodiment, cracks by stress F' will be reliably prevented from being made in semiconductor chip CP.

The resin-sealed device is deformed corresponding to the difference between the expansion coefficients of the metal and resin when the temperature of the resin-sealed device is raised by the operation. However, the stress in the resin formed on island portion 2 can be balanced with that in the resin formed on other portion of heat radiation plate 3. Therefore, formation of cracks in semiconductor chip CP due to thermal stress can be suppressed. This is because the occupied area of the portion having vertical length Y2 is reduced by the presence of cutout portions 7, and becomes closer in size to the occupied area of island portion 2 having vertical length Y1.

The position of cutout portions 7 of heat radiation plate 3 can be changed if stress occurring at the time of fastening the screw penetrating heat radiating plate 3 can be prevented from being applied to semiconductor chip CP. Further, in a case where cutout portions are formed on the side of lead frame 4 as shown in FIG. 5, it is possible to use a lead frame formed by punching a sheet of metal plate.

As described above, in the semiconductor device of this invention, stress which occurs at the time of mounting and is applied to the semiconductor chip can be sufficiently suppressed by providing cutout portions in part of the heat radiation plate. Therefore, it is possible to effectively prevent occurrence of cracks. When it is considered that occurrence of the cracks in the prior art cannot be set to be lower than 0.2%, the effect of this invention is significant. Further, formation of cutout portions makes it possible to set the area of the heat radiation plate substantially equal to that of the island portion. In this case, thermal stress caused in the resin by the expansion of the semiconductor device occurring during the operation cannot be easily applied to the semiconductor chip, thus suppressing occurrence of cracks due to the thermal stress in the semiconductor chip. In addition, the cutout portions described above can be easily formed by adequately processing the lead frame. Therefore, the lead frame with cutout portions which can attain the above effect can be designed without increasing the manufacturing cost even if the chip size is large. Thus, various types of semi-conductor chips can be mounted on the lead frame, and high performance semiconductor devices can be provided.

What is claimed is:

1. A semiconductor device comprising:
   a semiconductor chip;
   a heat radiation plate;
   a lead member connected to said semiconductor chip; and
   a mold member for sealing said semiconductor chip and part of said lead member in cooperation with said heat radiation plate;
   wherein said heat radiation plate includes a main body having a central area, and a fixing member attached to said central area to fix said semiconductor device to an external member, said main body further including a mounting portion projecting horizontally from said central area for mounting said semiconductor chip and first and second cutout portions located on the same side of said main body as said mounting portion and positioned on opposite sides of said central area of said main body for interrupting mechanical stresses formed in the semiconductor device by said fixing member.

2. A semiconductor device according to claim 1, wherein said first and second cutout portions extend in a direction in which said mounting portion and said central area are aligned.

3. A semiconductor device according to claim 4, further comprising a through hole formed in the central area of said main body.

4. A semiconductor device according to claim 1, wherein said first and second cutout portions are filled with said mold member.

5. A semiconductor device according to claim 1, wherein the rear surface of said heat radiation plate is partly exposed.

6. A semiconductor device according to claim 1, wherein said heat radiation plate further has a groove section formed in said mounting portion and surrounding said semiconductor chip.

7. A semiconductor device according to claim 6 wherein said groove section has at least two grooves.

8. A semiconductor device according to claim 1, wherein the thickness of said heat radiation plate is set substantially equal to that of said lead member.

9. A semiconductor device comprising:
   a semiconductor chip;
   a heat radiation plate having a mounting portion on which said semiconductor chip is mounted;
   a lead member connected to said semiconductor chip;
   a mold member for sealing said semiconductor chip and part of said lead member in cooperation with said heat radiation plate; and interrupting means for interrupting a stress applied to said semiconductor chip, wherein said interrupting means includes at least first and second cutout portions formed on opposite sides of said mounting portion in said radiation plate, and said first and second cutout portions are spaced from one another such that the area of said mounting portion is set substantially equal to that of the remainder of said heat radiation plate.

10. A semiconductor device according to claim 9, wherein said heat radiation plate and lead member are formed of metal, and said mold means is formed of resin.

11. A lead frame comprising:

a heat radiation plate;

a lead member for a semiconductor chip; and a supporting member for supporting said heat radiation plate and said lead member;

wherein said heat radiation plate includes a main body having a central area, a fixing member attached to said central area to fix the semiconductor device to an external member, a mounting portion projecting horizontally from said central area of said main body for mounting said semiconductor chip, and first and second cutout portions located on the same side of said main body a said mounting portion and on opposite sides of the central area of said main body for interrupting mechanical stresses formed in the semiconductor device by said fixing member.

12. A lead frame according to claim 11, wherein said heat radiation plate, lead member, and supporting member are constituted by part of a single metal plate.

* * * * *